(12) United States Patent
Pal

(10) Patent No.: US 7,492,594 B2
(45) Date of Patent: Feb. 17, 2009

(54) ELECTRONIC CIRCUIT MODULES COOLING

(75) Inventor: Debabrata Pal, Hoffman Estates, IL (US)

(73) Assignee: Hamilton Sundstrand Corporation, Rockford, IL (US)

( * ) Notice: Subject to any disclaimer, the term of this patent is extended or adjusted under 35 U.S.C. 154(b) by 0 days.

(21) Appl. No.: 11/799,908

(22) Filed: May 3, 2007

(65) Prior Publication Data

US 2008/0273303 A1 Nov. 6, 2008

(51) Int. Cl.
*H05K 7/20* (2006.01)
*F28F 7/00* (2006.01)

(52) U.S. Cl. .............. 361/699; 165/80.4; 361/689; 361/707; 361/708

(58) Field of Classification Search .......... 165/80.4; 257/714; 361/688–689, 699, 705, 708
See application file for complete search history.

(56) References Cited

U.S. PATENT DOCUMENTS

| | | | | |
|---|---|---|---|---|
| 3,616,533 A | * | 11/1971 | Heap et al. ............... 29/837 |
| 4,203,129 A | | 5/1980 | Oktay et al. | |
| 4,268,850 A | * | 5/1981 | Lazarek et al. ........... 257/714 |
| 4,392,153 A | * | 7/1983 | Glascock et al. ......... 257/746 |
| 5,050,037 A | * | 9/1991 | Yamamoto et al. ....... 361/699 |
| 5,539,617 A | * | 7/1996 | Bochtler .................. 361/699 |
| 5,774,334 A | * | 6/1998 | Kawamura et al. ...... 361/699 |
| 6,084,771 A | * | 7/2000 | Ranchy et al. ............ 361/699 |
| 6,208,511 B1 | | 3/2001 | Bortolini et al. | |
| 6,992,409 B2 | | 1/2006 | Torii et al. | |
| 7,005,734 B2 | | 2/2006 | Choi et al. | |
| 7,019,395 B2 | | 3/2006 | Hirano et al. | |
| 7,057,896 B2 | * | 6/2006 | Matsuo et al. ........... 361/704 |
| 7,224,493 B2 | * | 5/2007 | Chelvayohan et al. .... 358/405 |
| 7,248,478 B2 | | 7/2007 | Inoue | |
| 7,250,674 B2 | | 7/2007 | Inoue | |
| 7,252,167 B2 | | 8/2007 | Nakamura et al. | |
| 2002/0124997 A1 | | 9/2002 | Blome | |

FOREIGN PATENT DOCUMENTS

| | | |
|---|---|---|
| EP | 0239322 A3 | 9/1987 |
| EP | 1748688 A2 | 1/2007 |
| WO | 0079856 A1 | 12/2000 |

* cited by examiner

*Primary Examiner*—Gregory D Thompson
(74) *Attorney, Agent, or Firm*—Kinney & Lange, P.A.

(57) ABSTRACT

A cooling structure for electrical circuit devices having a pair of cooling ducts, each having a coolant passageway therein, and an electrical circuit device housing formed by a pair of spaced apart heat transfer plates each joined to a housing side to provide a sealed housing space. An electrical circuit device is positioned in that sealed housing space and each of the pair of heat transfer plates is positioned adjacent to, and thermally coupled to, a corresponding one of the pair of cooling ducts. An electrically insulative heat transfer material is provided in the sealed housing space so as to be capable of being in contact with the electrical circuit device also therein.

17 Claims, 2 Drawing Sheets

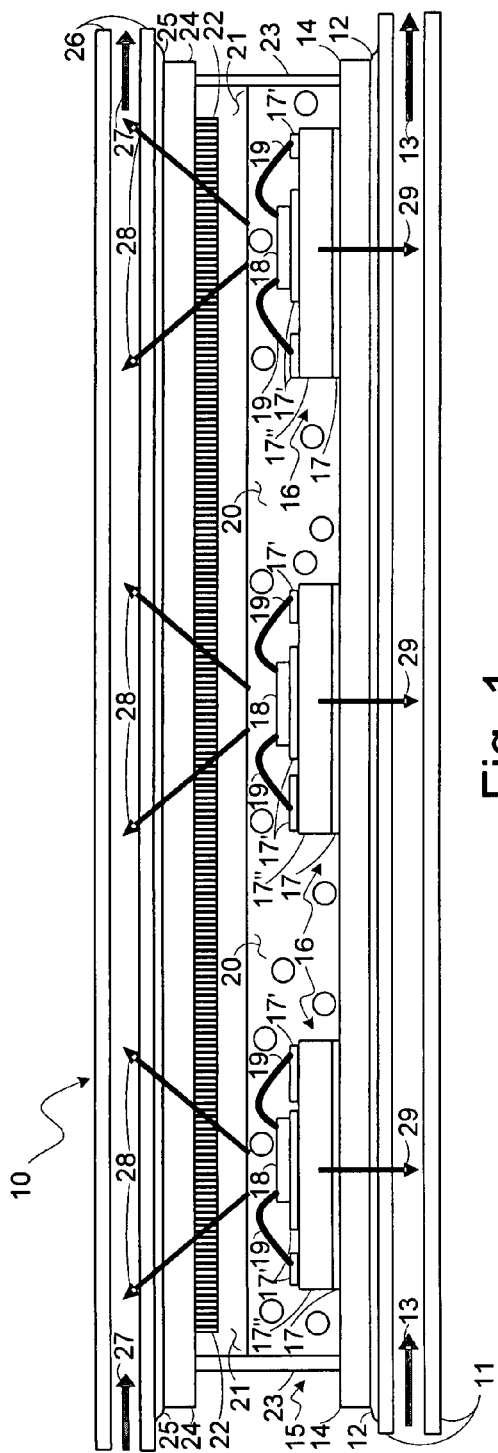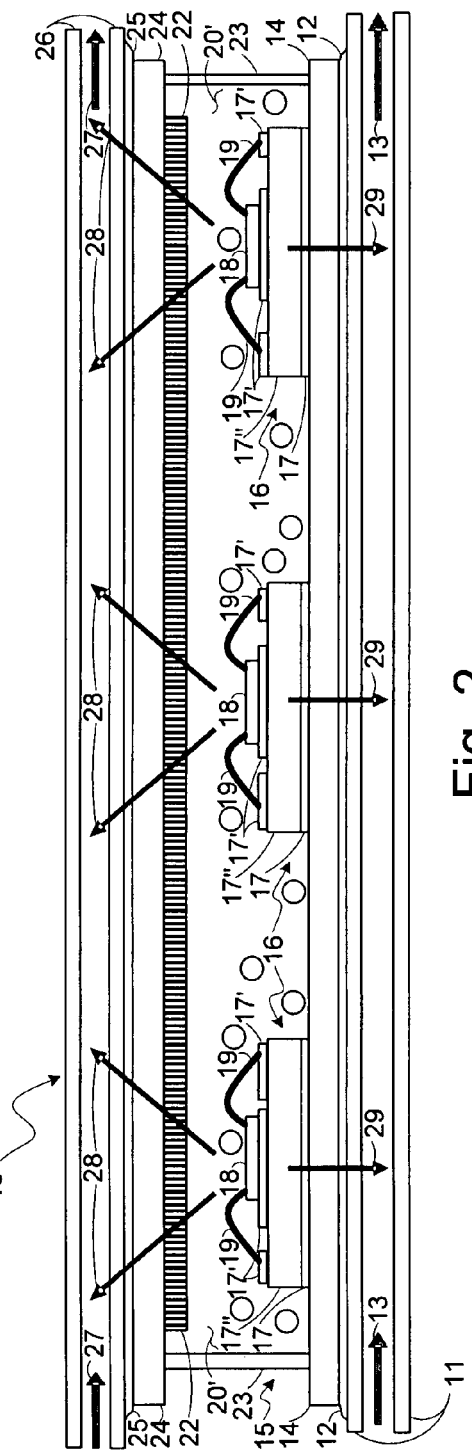

ELECTRONIC CIRCUIT MODULES COOLING

BACKGROUND

The present invention relates to removing excess heat from electronic circuit housings and, more particularly, to the removal of such heat through use of heat transporting coolants.

The operation of electronic circuits inevitably involves the dissipation of electrical energy into heat in the electronic and passive circuit device structures used in forming such circuits. These circuits are typically provided for use by being housed in some kind of housing arrangement. In those situations in which the generated heat is sufficiently removed simply through convection or conduction to the surrounding atmosphere, or both, to thereby avoid raising temperatures to values that could lead to failures in the circuits or the housings in which they are positioned, nothing more is needed for cooling such circuit housing arrangements.

However, some kinds of electronic circuits are used to control relatively large amounts of electrical power and are often provided in large power dissipation electronic module assemblies. Correspondingly, such circuits dissipate relatively large amounts of electrical power in the controlling of these much larger amounts of electrical power, and so result in the generation of too much heat in the housing arrangements for removal by just atmospheric based convection and conduction means. In these situations, further housing cooling provisions must be made to avoid temperatures in those housings being raised to values that lead to failures in the circuits or their housings. A typical such further provision is a duct, in which a coolant can be caused to flow to form a heat exchanger, and this duct is thermally coupled to one side of the electronic circuit housing being cooled thereby.

Such a duct provision for circuit housings, while an improvement over relying on just atmospheric based conduction and convection, is only a limited improvement for circuit housings in which the supported circuits generate sufficiently large amounts of heat primarily because of the thermal resistivity encountered over the transport paths. That is, although the cooling duct removes heat well from the circuit and housing portions relatively close thereto, heat that must be transported thereto from more remote portions thereof, usually mostly by conduction, is limited often by the relatively small thermal conductivities of the materials present along those transport paths. Those thermal conductivities can be improved by use of alternative materials along the transport paths or by adding more parallel paths through broadening the heat sources such as by using heat generating components having larger sizes or lateral extents, or by enlarging the housing to have more area abutting the cooling duct. Such remedies, however, either substantially add to the cost or the weight of the circuit housings, or both. Thus, there is a desire for better arrangements to sufficiently remove excessive heat generated in housed circuit devices during their operation.

SUMMARY

The present invention provides a cooling structure for electrical circuit devices dissipating energy as heat during operation of electrical circuits in which such devices are electrically connected with the cooling structure having a pair of cooling ducts. Each cooling duct has a passageway therein formed by passageway walls thereabout through which a coolant can selectively be caused to flow and an electrical circuit device housing formed by a pair of spaced apart heat transfer plates each joined to a housing side extending between them to provide a sealed housing space. An electrical circuit device is positioned in that sealed housing space and each of the pair of heat transfer plates is positioned adjacent to, and thermally coupled to, a corresponding one of the pair of cooling ducts. An electrically insulative heat transfer material is provided in the sealed housing space so as to be capable of being in contact with the electrical circuit device also therein.

BRIEF DESCRIPTION OF THE DRAWINGS

FIG. 1 shows a cross-sectional side view diagrammatic representation of an electronic circuit housing arrangement embodying the present invention, FIG. 2 shows a cross-sectional side view diagrammatic representation of another electronic circuit housing arrangement embodying the present invention.

DETAILED DESCRIPTION

Figure 3:
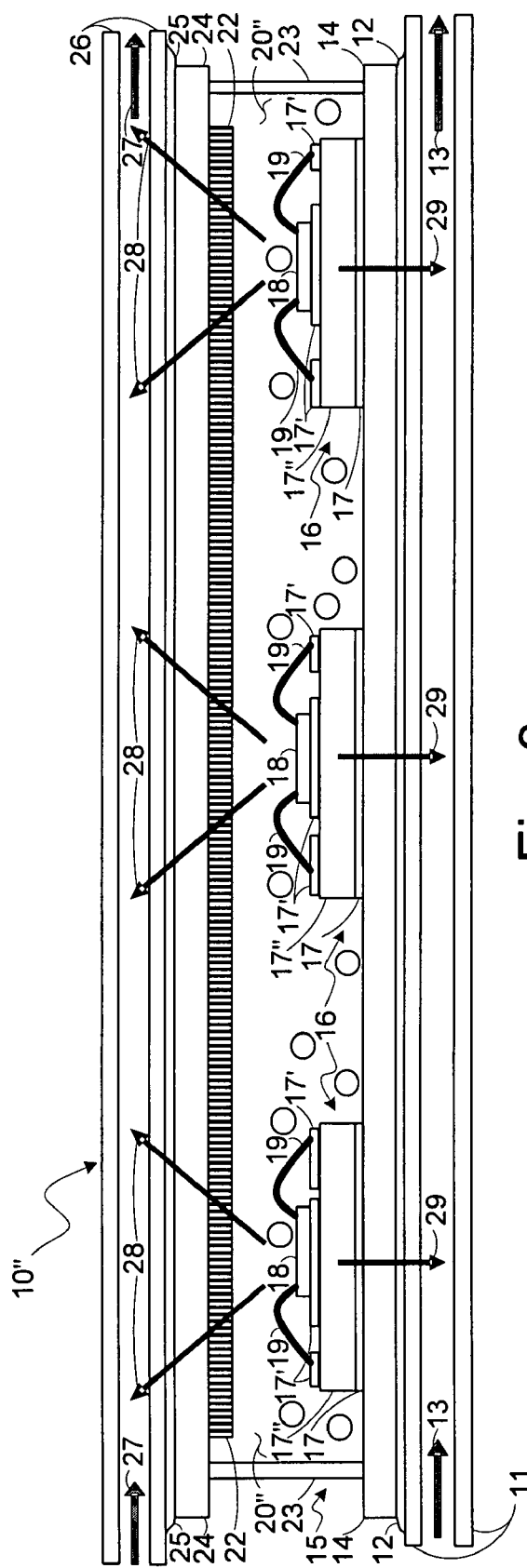
FIG. 3 shows a cross-sectional side view diagrammatic representation of yet another electronic circuit housing arrangement embodying the present invention.

The present invention provides a second coolant transport duct that can form a heat exchanger on the opposite side of the electronic circuit housing from the first coolant transport duct described above but is thermally coupled to the circuit device in which heat is generated differently than is the first duct. The first duct is thermally coupled to the heat generating circuit devices primarily by conduction. Those devices are supported on a sequence of thermally conductive material layers each in contact with its adjacent neighbor or neighbors in the circuit housing structure thereby providing a direct thermally conductive path between the heat generating circuit devices and the first duct. However, the presence of electrical circuit interconnections of various sorts on the sides of the heat generating circuit devices opposite the sides thereof nearest the first duct prohibits use of solid material layers forced against these opposite sides for good conductive thermal contact, especially use of any electrically conductive material layers which are often also the choice in other circumstances for good thermal conductivity materials. Thus, an alternative heat transfer arrangement is needed between the heat generating circuit devices and the second duct.

FIG. 1 shows a cross-sectional side view of a diagrammatic representation for such an alternative electronic circuit housing arrangement, 10. A first duct, 11, is formed of two separated aluminum plate-like structures with the upper one having a thermal grease, 12, thereon to keep it well thermally coupled to the electronic circuit component enclosure structure adjacent thereto. The separation space between the two separated aluminum plate-like structures in first duct 11 provides the passageway through which a coolant liquid, 13, represented by directed arrows, is caused to flow to transport away with it heat absorbed thereby from the plate-like structures in duct 11. Various structures are brazed together (not shown) in forming duct 11 with its plate-like structures and the passageway connections therein through which coolant 13 is supplied to flow through the separation space passageway between its plate-like structures when cooling is desired. Finned structures (not shown) can be provided in this passageway thermally coupled (typically through brazing) to the plate-like structures forming same to aid in the transfer of heat transferred to these structures to coolant 13. Coolant 13, although possibly a gas in some circumstances, is typically a liquid such as polyalphaolefin or a propylene glycol and water mixture which alternatives both have relatively large thermal conductivities and specific heats for transferring heat but also have relatively low viscosity to thereby keep pressure drops relatively small along the passageway during coolant flows.

A first thermal transfer, or base, plate, 14, formed of copper, is fastened to first duct 11 with thermal grease 12 between a first side of that plate and duct 11. This fastening typically is provided by some sort of fastening screws (not shown), and the resulting arrangement provides for conducting heat from plate 14 to coolant 13. A component enclosure structure, 15, in electronic circuit housing arrangement 10 is provided based on plate 14, and so the opposite side of base plate 14 has supported directly thereon, and bonded thereto, a plurality of mounting pedestals, 16, each having a lower direct bond copper layer, 17, and another upper direct bonded segmented copper layer, 17', bonded to opposite sides of an electrical insulator layer, 17", formed of either aluminum oxide or nitride. The segments of upper copper layer 17' in each mounting pedestal 16 form electrical interconnections for a corresponding one of a plurality of substantial electrical power management semiconductor material transistor chips, 18, also mounted on a segment of layer 17' of that pedestal, and which chip so mounted is electrically connected to such pedestal segments by a corresponding set of wire bonds, 19. Heat generated in operating the electrical circuits containing chips 18 is in part conducted from each of those chips through the corresponding one of mounting pedestals 16 to plate 14, and subsequently conducted to flowing coolant 13 in duct 11 to thereby be transported away.

Pedestals 16 and power transistor chips 18 are shown in FIG. 1 submerged in a dielectric liquid, 20, contained in the enclosed space in component enclosure structure 15, in which bubbles containing vapors of that liquid (shown as circles in liquid 20 in FIG. 1) form due to part of the heat generated in chips 18 during operations of the circuits containing them (boiling of liquid 20) as a single component working fluid in a two phase system. These bubbles buoyantly float up to the surface of liquid 20 to join the accumulating vapor of that liquid in a space, 21, above that liquid and accumulate there about a thermally conductive finned structure, 22, in that enclosed space. Heat is taken up by liquid 20 undergoing a phase change from liquid to vapor 21 thereby accomplishing the absorption of significant amounts of heat in providing the latent heat of vaporization needed to convert small amounts of liquid to the vapor shown as the circles in liquid 20 in the figure. Accumulated vapor 21 condenses on the fins of finned structure 22 so that the latent heat of vaporization released in doing so is taken up in those fins and conducted from there to second heat transfer plate 24. Liquid 20 in such a single component, two phase working fluid system can be taken from the general fluid classes of Novec™ hydrofluoroether (HFE), such as HFE-7100 fluid, or Fluorinert™ (FC), such as FC-72 or FC-84 fluid, all sold by the 3M Co.

Alternatively, dielectric liquid 20 can be provided as a single component working fluid in just a single phase by providing liquid 20 in a quantity sufficient to fill, or essentially fill, the enclosed space of the component enclosure structure (not shown in FIG. 1). This arrangement will thereby eliminate, or nearly eliminate, vapor space 21 so that liquid 20 is in direct contact with both transistor chips 18 and finned structure 22 thereby allowing heat from the former to be conducted to the latter. Liquid 20 in this latter arrangement can be a silicone cooling fluid such as Dow Corning® 550 sold by the Dow Corning Corporation. However, such a single component, single phase working fluid leads to a greater thermal gradient along the heat transport path in the electronic circuit housing structure than does a single component, two phase working fluid, and more of liquid 20 for the single component, single phase working fluid is needed to fill or essentially fill the electronic circuit housing structure thereby adding to both the cost and the weight of housed circuit components.

Both liquid 20 and vapor 21 (if present) are, as indicated, contained in the enclosed space provided in component enclosure structure 15 in electronic circuit housing arrangement 10 that results from base plate 14 therein being bonded at a surface thereof, opposite that surface adjacent to first duct 11, to one end of an enclosing housing side, 23, and by a second thermal transfer plate, 24, being bonded at a first side thereof to the opposite end of housing side 23. Housing side 23 is formed of formed of a high temperature plastic with a temperature coefficient of expansion not too different from that of base plate 14. Such a material can be any of 25 to 40% fiber reinforced polyphenyl sulphide (PPS) having a maximum operating temperature of 210° C. and a temperature coefficient of $29 \times 10^{-6}/°$ C., 25 to 40% fiber reinforced polyether sulfone (PES) having a maximum operating temperature of 210° C. and a temperature coefficient of $23 \times 10^{-6}/°$ C., or 25 to 40% fiber reinforced polyester having a maximum operating temperature of 150° C. and a temperature coefficient of $20 \times 10^{-6}/°$ C. as circuit and housing operating temperatures allow. Bonding can be either adhesive bonding or ultrasonic bonding.

Second heat transfer plate 24 is formed of aluminum with finned structure 22 being thermally coupled thereto at the first side thereof. This coupling can come about through finned structure 22 being integral to that plate by being formed from a starting aluminum plate that is thicker than the final thickness of plate 24 from which starting plate the material initially between the resulting fins has been removed such as by etching or sawing. Alternatively, finned structure 22 can be formed as a separate structure subsequently fastened to plate 24 in a thermally coupled manner such as by brazing them together.

Thermal grease, 25, on a second side of second heat transfer plate 24 thermally couples the component enclosure structure to a second duct, 26, in electronic circuit housing arrangement 10 which duct is formed as is first duct 11 of two separated aluminum plate-like structures forming the walls of a passageway in the separation space therebetween. Here, too, thermal grease 25 is located between a second side of plate 24 and duct 26 to transfer heat from component enclosure structure 15 to this duct, and they are fastened to each other typically again with some sort of fastening screws (not shown). Again, various structures are brazed together (not shown) in forming duct 26 with its plate-like structures and the passageway connections therein through which a coolant, 27, again represented by directed arrows and typically of the same substance as that used for coolant 13, is supplied to flow through the separation space passageway between those plate-like structures when cooling is desired. As before, finned structures (not shown) can be provided in this passageway thermally coupled to the plate-like structures forming same (typically by brazing) to aid in the transfer of heat, that has been transferred to these structures, to coolant 27.

Thus, a heat portion represented by directed arrows, 28, that has been taken up by finned structure 22 from chips 18 and liquid 20 and its vapors, is then conducted to second heat transfer plate 24 and from there conducted through thermal grease 25 to duct 26 and then to flowing coolant 27 to thereby be transported away. Another portion of the heat generated in chips 18 is conducted through pedestals 16 and liquid 20 to base plate 14, as described above, and represented by directed arrows, 29, and this portion is conducted to coolant 13 for removal.

As a further alternative to just having dielectric liquid 20 being provided as a single component working fluid in only a single phase, as described above, there is shown in FIG. 2 a cross-sectional side view of a diagrammatic representation of another electronic circuit housing arrangement, 10'. In addition to providing a fill in the unoccupied space in electronic component enclosure 15 based on the same kind of liquid as liquid 20 as was provided in this space in this electronic circuit housing arrangement (as in the alternative described above for FIG. 1 leaving no vapor space 21), a very large number of electrically insulative, thermally conductive nanoparticles are added as the dispersed phase to that liquid serving as the continuous phase in a liquid particle suspension mixture, or colloidal system like a sol, 20'. Liquid particle suspension mixture 20' has a larger effective thermal conductivity as a result of being a mixed phase heat transporting working fluid than does that of liquid 20 used alone.

Powders of boron nitride (BN), optimally distributed in some sense in being dispersed in the liquid phase, can serve as the nanoparticles, but nanoparticles of alumina ($Al_2O_3$) are a suitable alternative. Finned structure 22 is shown present in component enclosure 15 in arrangement 10' as this will enhance conductive heat transfer from liquid particle suspension mixture 20' to coolant 27 through plate 24, thermal grease 25 and duct 26, but this finned structure is not as necessary here as it is in arrangement 10 of FIG. 1 because here there need not be surface for condensing a vapor, and so this structure could be omitted.

In yet another alternative, there is shown in FIG. 3 a cross-sectional side view of a diagrammatic representation of another electronic circuit housing arrangement, 10", with another kind of colloidal system based on a soft matter, or compliant, electrically insulative encapsulant material such as a gel that can be used in place of liquid 20 at least in part for a continuous phase. Again, electrically insulative, thermally conductive nanoparticles, such as the kinds indicated above, are dispersed therein to increase the thermal conductivity of the resulting mixture. A silicone gel is suitable for this purpose. The compliance of the resulting gel based mixture, 20", reduces any stress that may otherwise occur on wire bonds 19. Finned structure 22 is again shown in component enclosure space 15 thermally coupled to plate 24 to enhance heat transfer but again could be omitted.

Although the present invention has been described with reference to preferred embodiments, workers skilled in the art will recognize that changes may be made in form and detail without departing from the spirit and scope of the invention.

The invention claimed is:

1. A cooling structure for electrical circuit devices positioned therein that dissipate energy as heat during operation of electrical circuits in which such devices are electrically connected, the cooling structure comprising:

a pair of cooling ducts each having a passageway therein formed by passageway walls thereabout and through each of which a coolant can selectively be caused to flow to transport heat away from the cooling structure, an electrical circuit device housing formed by a pair of spaced apart heat transfer plates each joined to a housing side extending between them to provide a sealed housing space in which at least one of the electrical circuit devices is positioned and with each of the heat transfer plates in the pair thereof positioned adjacent to, and thermally coupled to, a corresponding one of the cooling ducts in the pair thereof, and an electrically insulative heat transfer material provided in the sealed housing space so as to be capable of being in contact with at least one of the heat transfer plates in the pair thereof and the one or more electrical circuit devices positioned therein.

2. The cooling structure of claim 1 wherein the electrically insulative heat transfer material is a liquid.

3. The cooling structure of claim 2 further comprising the electrically insulative heat transfer material having a plurality of electrically insulative, thermally conductive particles dispersed therein.

4. The cooling structure of claim 1 wherein the electrically insulative heat transfer material is a gel.

5. The cooling structure of claim 4 further comprising the electrically insulative heat transfer material having a plurality of electrically insulative, thermally conductive particles dispersed therein.

6. The cooling structure of claim 1 wherein the electrical circuit device is joined to one of the pair of heat transfer plates.

7. The cooling structure of claim 6 wherein the electrically insulative heat transfer material is a liquid.

8. The cooling structure of claim 7 further comprising the electrically insulative heat transfer material having a plurality of electrically insulative, thermally conductive particles dispersed therein.

9. The cooling structure of claim 6 wherein the electrically insulative heat transfer material is a gel.

10. The cooling structure of claim 9 further comprising the electrically insulative heat transfer material having a plurality of electrically insulative, thermally conductive particles dispersed therein.

11. A cooling structure for electrical circuit devices positioned therein that dissipate energy as heat during operation of electrical circuits in which such devices are electrically connected, the cooling structure comprising:

a pair of cooling ducts each having a passageway therein formed by passageway walls thereabout and through each of which a coolant can selectively be caused to flow to transport heat away from the cooling structure, an electrical circuit device housing formed by a pair of spaced apart heat transfer plates each joined to a housing side extending between them to provide a sealed housing space in which at least one of the electrical circuit devices is positioned and with each of the heat transfer plates in the pair thereof positioned adjacent to, and thermally coupled to, a corresponding one of the cooling ducts in the pair thereof, there being a finned structure having a plurality of spaced apart fin members on one side thereof relatively close to the electrical device and having the other side thereof joined with one of the pair of heat transfer plates, and an electrically insulative heat transfer material provided in the sealed housing space so as to be capable of being in contact with at least one of the heat transfer plates in the pair thereof and the one or more electrical circuit devices positioned therein.

12. The cooling structure of claim 11 wherein the electrically insulative heat transfer material is a liquid.

13. The cooling structure of claim 12 further comprising the electrically insulative heat transfer material having a plurality of electrically insulative, thermally conductive particles dispersed therein.

14. The cooling structure of claim 11 wherein the electrically insulative heat transfer material is a gel.

15. The cooling structure of claim 14 further comprising the electrically insulative heat transfer material having a plurality of electrically insulative, thermally conductive particles dispersed therein.

16. The cooling structure of claim 11 wherein the electrical circuit device is joined to the remaining one of the pair of heat transfer plates not joined with the finned structure.

17. A cooling structure for electrical circuit devices positioned therein that dissipate energy as heat during operation of electrical circuits in which such devices are electrically connected, the cooling structure comprising:

a pair of cooling ducts each having a passageway therein formed by passageway walls thereabout and through each of which a coolant can selectively be caused to flow to transport heat away from the cooling structure, an electrical circuit device housing formed by a pair of spaced apart heat transfer plates each joined to a housing side extending between them to provide a sealed housing space in which at least one of the electrical circuit devices is positioned and with each of the heat transfer plates in the pair thereof positioned adjacent to, and thermally coupled to, a corresponding one of the cooling ducts in the pair thereof, such that one of the heat transfer plates in the pair thereof is positioned adjacent to a corresponding one of the cooling ducts in the pair thereof and has the thermal coupling therebetween provided at least in part by a thermal grease located therebetween, and an electrically insulative heat transfer material provided in the sealed housing space so as to be capable of being in contact with at least one of the heat transfer plates in the pair thereof and the one or more electrical circuit devices positioned therein.

* * * * *